United States Patent
Saxler

(10) Patent No.: US 6,875,995 B2
(45) Date of Patent: Apr. 5, 2005

(54) HETEROGENEOUS BANDGAP STRUCTURES FOR SEMICONDUCTOR DEVICES AND MANUFACTURING METHODS THEREFOR

(75) Inventor: Adam William Saxler, Durham, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 10/619,228

(22) Filed: Jul. 14, 2003

(65) Prior Publication Data

US 2004/0031956 A1 Feb. 19, 2004

Related U.S. Application Data

(60) Provisional application No. 60/403,947, filed on Aug. 16, 2002.

(51) Int. Cl.⁷ ............... H01L 29/06; H01L 31/0328; H01L 31/0336; H01L 31/072; H01L 31/109
(52) U.S. Cl. ............................................. 257/14
(58) Field of Search .................. 257/9, 12, 13, 257/14, 15, 17, 21, 22, 23, 24, 25, 77, 78, 79, 86, 94, 101, 90, 441, 442, 102, 103

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,201,051 A | 4/1993 | Koide | 395/725 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,682,041 A | 10/1997 | Kawakubo et al. | 257/38 |
| 5,739,554 A | 4/1998 | Edmond et al. | 257/103 |
| 5,831,277 A | 11/1998 | Razeghi | 257/15 |
| 5,912,477 A | 6/1999 | Negley | 257/95 |

(Continued)

FOREIGN PATENT DOCUMENTS

WO    WO02/48434    6/2002

OTHER PUBLICATIONS

Saxler et al., "Aluminum gallium nitride short–period superlattices doped with magnesium," Applied Physics Letters, vol. 74, No. 14, Apr. 5, 1999, pp. 2023–2025.

(Continued)

Primary Examiner—Hoai Pham
Assistant Examiner—Dana Farahani
(74) Attorney, Agent, or Firm—Myers Bigel Sibley & Sajovec

(57) ABSTRACT

Semiconductor devices include a wide bandgap semiconductor layer having an array of discontinuous wide bandgap semiconductor regions therein that contribute to a reduction in ionization energies of dopants in the wide bandgap semiconductor layer relative to an otherwise equivalent wide bandgap semiconductor layer that is devoid of the array of discontinuous wide bandgap semiconductor regions. The discontinuous wide bandgap semiconductor regions and the wide bandgap semiconductor layer have the same net conductivity type, but the discontinuous wide bandgap semiconductor regions are typically more highly doped to thereby provide excess charge carriers to the wide bandgap semiconductor layer.

39 Claims, 3 Drawing Sheets

U.S. PATENT DOCUMENTS

| | | | |
|---|---|---|---|
| 5,932,899 A | 8/1999 | Schubert | 257/191 |
| 6,087,674 A | 7/2000 | Ovshinsky et al. | 257/2 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,323,053 B1 | 11/2001 | Nishikawa et al. | 438/46 |
| 6,329,668 B1 | 12/2001 | Razeghi | 257/14 |
| 6,444,896 B1 | 9/2002 | Harman et al. | 136/239 |
| 6,486,499 B1 | 11/2002 | Krames et al. | 257/81 |
| 6,500,694 B1 | 12/2002 | Enquist | 438/109 |
| 6,507,105 B1 | 1/2003 | Yamagata et al. | 257/720 |
| 2002/0039833 A1 * | 4/2002 | Bensahel et al. | 438/503 |
| 2003/0059971 A1 * | 3/2003 | Chua et al. | 438/46 |

OTHER PUBLICATIONS

Kozodoy et al., "Polarization–enhanced Mg doping of AlGaN/GaN superlattices," Applied Physics Letters, vol. 75, No. 16, Oct. 18, 1999, pp. 2444–2446.

Saxler, "A review of the electrical properties of $Al_xGa_{1-x}N$ materials for UV photodetector applications," Photodetectors: Materials and Devices V, Proceedings of SPIE, vol. 3948 (2000), pp. 330–341.

Saxler et al., "Electrical characterization of AlxGa1–xN for UV photodector applications," SPIE vol. 3629, Jan. 1999, pp. 211–222.

* cited by examiner

HETEROGENEOUS BANDGAP STRUCTURES FOR SEMICONDUCTOR DEVICES AND MANUFACTURING METHODS THEREFOR

RELATED APPLICATION

The present application claims the benefit of and priority from U.S. Provisional Patent Application No. 60/403,947, filed Aug. 16, 2002, the disclosure of which is hereby incorporated herein by reference in its entirety.

FIELD OF THE INVENTION

This invention relates to microelectronic devices and fabrication methods therefor, and more particularly to structures for vertical devices and manufacturing methods therefor.

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

One measure of efficiency of LEDs is the cost per lumen. The cost per lumen for an LED may be a function of the manufacturing cost per LED chip, the internal quantum efficiency of the LED material and the ability to couple or extract the generated light out of the device. An overview of efficiency issues may be found in the textbook entitled *High Brightness Light Emitting Diodes* to Stringfellow et al., Academic Press, 1997, and particularly Chapter 2, entitled *Overview of Device Issues in High-Brightness Light Emitting Diodes*, to Craford, at pp. 47–63.

Much development interest and commercial activity recently has focused on LEDs that are fabricated in or on wide bandgap materials such as silicon carbide, because these LEDs can emit radiation in the blue/green portions of the visible spectrum. See, for example, U.S. Pat. No. 5,416,342 to Edmond et al., entitled *Blue Light-Emitting Diode With High External Quantum Efficiency*, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled *Pendeoepitaxial Gallium Nitride Semiconductor Layers On Silicon Carbide Substrates,* the disclosure of which is hereby incorporated herein by reference in its entirety as if set forth fully herein.

While efforts to date have provided commercially viable wide bandgap semiconductor devices such as those described above, such devices may still benefit from improvements in efficiency. For example, one issue that may reduce the efficiency of a wide bandgap semiconductor device is related to the forward voltages of such devices. In vertical devices, high resistivity layers may result when the thermal energy (kT) is small compared to the ionization energy of the dopants. Such high resistivity layers may increase the forward voltage drop across the device. Thus, reductions in the resistivity of layers may reduce the forward voltages of wide bandgap semiconductor devices and, thereby, improve the efficiency of such devices.

One proposed technique for enhancing device performance is through the use of a short-period superlattice. Such a technique is described in Saxler et al., "Aluminum gallium nitride short-period superlattice doped with magnesium," Applied Physics Letters, Vol. 74, No. 14, April, 1999, pp. 2023–2025 and Kozodoy et al., "Polarization-enhanced Mg doping of AlGaN/GaN superlattices," Applied Physics Letters, Vol. 75, No. 15, October 1999, pp. 2444–2446. Such superlattice structures utilize alternating continuous layers of materials in an effort to improve acceptor ionization percentage and conductivity and, thereby, reduce the overall resistivity of the structure.

SUMMARY OF THE INVENTION

Embodiments of the present invention provide semiconductor structures that include a layer of semiconductor material having a first bandgap and a plurality of regions of semiconductor material dispersed within the layer of semiconductor material and spaced apart from each other. The regions of semiconductor material have a second bandgap that is higher than the first bandgap. In particular embodiments, the semiconductor material is a wide bandgap semiconductor material. Furthermore, the regions of wide bandgap semiconductor material do not form a continuous layer but are formed to have space between the plurality of regions. Such semiconductor structures may be utilized, for example, in devices such as diodes, light emitting diodes, laser diodes, heterojunction bipolar transistors (HBTs), bipolar junction transistors (BJTs), photodetectors or other such semiconductor devices. In particular, structures according to embodiments of the present invention may be utilized in vertical semiconductor devices.

The discontinuous regions formed in the layer of semiconductor material may be provided, for example, by selective growth of regions of semiconductor material, patterning of a blanket formed layer of semiconductor material and/or other such techniques for the selective formation of differing materials within a layer of wide bandgap semiconductor material. Furthermore, the discontinuous regions, the layer and/or regions of the layer may be doped. For example, if the higher bandgap material is AlInGaN, magnesium or silicon dopants may be provided depending on the conductivity type of the layer in which the discontinuous regions are formed. As a result, in some embodiments, the ionization energy of the dopants may be reduced from that of a similar material of uniform composition which may increase the carriers available for transport without substantially hindering vertical transport.

In particular embodiments of the present invention, the wide bandgap material is a Group III nitride. In further embodiments of the present invention, the wide bandgap material is a gallium nitride based semiconductor material, such as GaN, AlGaN, AlInGaN or the like.

DETAILED DESCRIPTION OF EMBODIMENTS OF THE INVENTION

Figure 1:
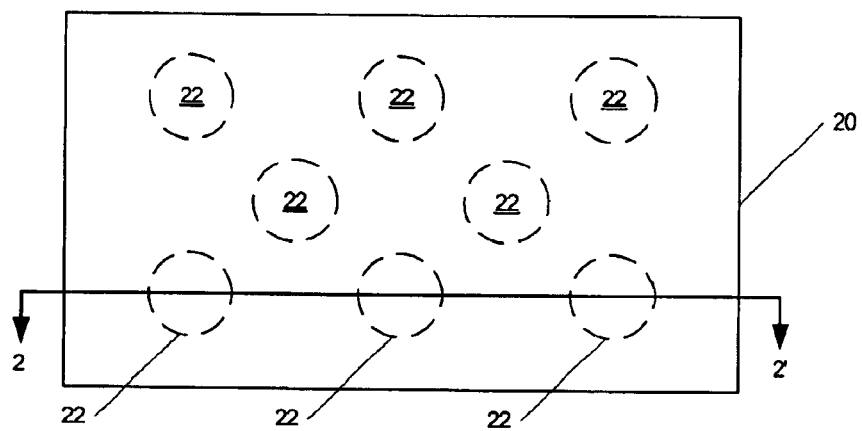
FIG. 1 is a top view of a portion of a layer of wide bandgap material according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Embodiments of the present invention are described below with reference to a Group III nitride based semiconductor structure. However, as will be appreciated by those of skill in the art in light of the present disclosure, embodiments of the present invention may be advantageously utilized with other semiconductor materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Furthermore, embodiments of the invention are described below with reference to gallium nitride-based light emitting diodes on silicon carbide-based substrates. However, embodiments of the present invention may be suitable for use in any wide bandgap device for increasing the electrical conductivity of a layer in the device. Thus, while embodiments of the present invention may be particularly well suited for use in vertical devices, the present invention should not be construed as limited to such devices. Furthermore, the present invention should not be construed as limited to gallium nitride based layers but may be applicable to other wide bandgap layers. As used herein, the term wide bandgap refers to semiconductor materials with a bandgap of greater than about 2 eV. While embodiments of the present invention are described herein with reference to wide bandgap semiconductor materials, embodiments of the present invention may also be useful for narrower bandgap materials at lower temperatures such that an increased number of carriers are available at operating temperatures.

Figure 2:
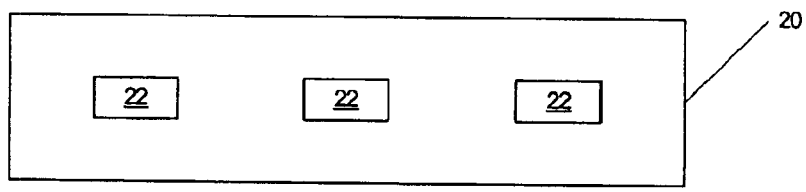
FIG. 2 is a cross section of the portion of a layer of wide bandgap material of FIG. 1 taken along the lines 2–2'.

FIG. 1 is a top view of a layer of wide bandgap semiconductor material according to embodiments of the present invention. As seen in FIG. 1, a first layer 20 of wide bandgap semiconductor material having a first bandgap has included therein regions 22 of wide bandgap semiconductor material having a second bandgap. The first bandgap is narrower than the second bandgap. As seen in FIG. 2, the regions 22 of wide bandgap semiconductor material are disposed within the first layer 20 of wide bandgap semiconductor material. Thus, the regions 22 have a periphery that is spaced apart from upper and lower faces of the first layer 20 and from each other. The regions 22 may be of any polygonal or non-polygonal shape and need not be the same size or shape, need not be uniformly spaced and need not be all in one plane.

In certain embodiments of the present invention, the layer 20 and the regions 22 may be any wide bandgap semiconductor material. In some embodiments of the present invention the layer 20 and the regions 22 are nitride-based structures. In still further embodiments, the wide bandgap semiconductor material is a Group III nitride, such as GaN, AlGaN, InGaN, AlN, AlInGaN or the like. In any case, the layer 20 has a narrower bandgap than the regions 22. In certain embodiments of the present invention, the composition of the regions 22 and the layer 20 may be the same, however, the mole fractions may be varied to provide differing bandgaps. For example, the layer 20 may be $Al_wIn_xGa_{1-w-x}N$, where $0 \leq w \leq 1$ and $0 \leq x \leq 1$ and $w+x \leq 1$, and the regions 22 may be $Al_yIn_zGa_{1-y-z}N$ where $0 \leq y \leq 1$ and $0 \leq z \leq 1$ and $y+z \leq 1$, and where the selection of y and/or z provide a wider bandgap than provided by w and x.

In some embodiments of the present invention, the layer 20 has a bandgap that is from about 0.1 to about 3.0 eV less than the bandgap of the regions 22. Furthermore, in some embodiments of the present invention, the regions 22, the layer 20 and/or regions of the layer 20 may be doped with ions, such as Si or Mg for GaN based structures. The particular doping levels should be high enough to reduce the resistivity by increasing the number of free carriers but not so high as to cause undesired structural defects in the crystal structure. In certain embodiments, the doping level is provided to reduce the resistivity of the layer 20 to below a level where it no longer provides a substantial contribution to a forward voltage drop of a device. In further embodiments, most of the doping is provided in the regions 22 to minimize ionized impurity scattering and maximize ionization of dopants. The incorporation of the regions 22 may decrease the ionization energy of the dopants so as to provide an increase in free carriers in the layer 20. This increase in free carriers may increase the conductivity of the material such that forward voltages of devices incorporating embodiments of the present invention may be reduced. By providing regions 22, rather than continuous layers, improved electrical conductivity in the vertical direction (i.e. a direction substantially orthogonal to the growth plane) may be achieved.

Figure 3:
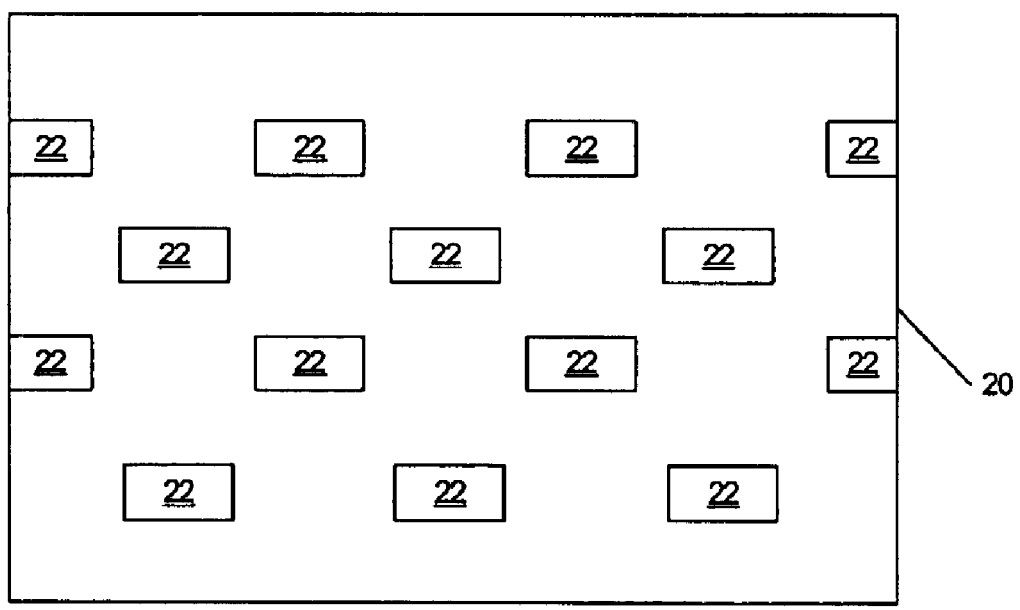
FIG. 3 is a cross section of a portion of a layer of wide bandgap material according to further embodiments of the present invention.

While the regions 22 are illustrated in FIGS. 1 and 2 as substantially cylindrical, other shapes may be used. For example, a grid pattern, stripes, bumps, conical, frusto-conical or irregular shapes and/or regular, irregular and/or random patterns may also be utilized as long as the regions 22 are discontinuous such that carrier transport may occur through portions layer 20 of the narrower bandgap semiconductor material. The size and spacing of the regions 22 within the layer 20 may be varied depending on the materials used. Furthermore, multiple courses of regions 22 may be provided that are aligned, staggered and/or random relative to each other. For example, in the embodiments illustrated in FIG. 3, the layer 20 includes differing courses of regions 22 that are staggered. In general, however, the size and spacing may be such so as to provide large enough piezoelectric fields so as to aid in ionization. In certain embodiments of the present invention, lateral dimensions are small enough to not impede vertical transport significantly. In particular embodiments, fractional area/density of the regions 22 are high enough to provide a substantial increased carriers but not so high as to impede vertical transport. The thickness of the regions 22 may be thick enough to provide room for the dopants and to take advantage of piezoelectric effects but thin enough to provide nearly complete ionization without excessive band bending. However, care may taken to assure that free carriers are not too localized so that the free carriers can contribute to vertical transport.

Differing techniques may be utilized for formation of the regions 22 and the layer 20. For example, the regions 22 may be fabricated by beginning growth of the layer 20 and then changing growth parameters to provide incomplete growth of a layer of wider bandgap material to provide the discontinuous regions 22. Growth of the narrower bandgap material would then be continued to provide the remainder of the layer 20. The incomplete growth of the regions 22 may, in some embodiments, be provided by utilizing growth parameters that provide 3D island growth and/or terminating growth prior to complete coalescence into a continuous film.

In other embodiments of the present invention, the discontinuous regions 22 may be provided by a blanket formation of a layer of the wider bandgap semiconductor material and the patterning of that layer. For example, a layer could be formed by epitaxial growth, deposition or other such techniques known to those of skill in the art and patterned utilizing etching and/or lift-off techniques or other such techniques known to those of skill in the art.

Figure 4:
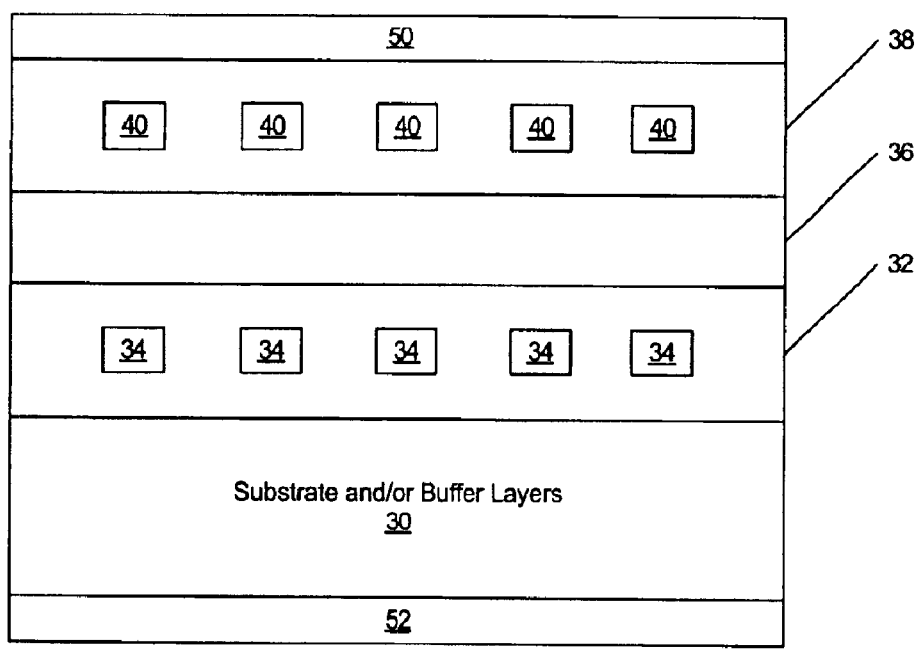
FIG. 4 is a cross section of an exemplary light emitting diode according to embodiments of the present invention.

FIG. 4 illustrates the utilization of embodiments of the present invention in a simplified vertical diode structure. As seen in FIG. 4, a first layer 32 of a first wide bandgap semiconductor material is provided on a substrate and/or buffer layers 30, such as a silicon carbide substrate with an AlN buffer layer. A similar substrate and/or buffer layer(s) may be employed in the embodiments illustrated in FIGS. 1 and 2.

Returning to FIG. 4, incorporated in the first layer 32 are regions 34 of a second wide bandgap semiconductor material where the bandgap of the first wide bandgap semiconductor material is narrower than the bandgap of the second wide bandgap semiconductor material. As described above, the regions 34 are disposed within the first wide bandgap semiconductor material so as to provide discontinuous regions 34 within the first layer 32. In particular embodiments of the present invention, the first layer 32 and the regions 34 are both AlInGaN based materials. The regions 34 may also be doped with Si. In some embodiments of the present invention, the first layer 32 or certain regions of the first layer 32 are doped with Si.

An optional second layer 36 of a third semiconductor material(s) may be provided between the first layer 32 and a third layer 38 and may have a lower bandgap than that of the first layer 32 and the third layer 38 to provide a well region for the device. Contacts 50 and 52 may also be provided.

The third layer 38 is a fourth wide bandgap semiconductor material. Incorporated in the third layer 38 are regions 40 of a fifth wide bandgap semiconductor material where the bandgap of the fourth wide bandgap semiconductor material is narrower than the bandgap of the fifth wide bandgap semiconductor material. As described above, the regions 40 are disposed within the fourth wide bandgap semiconductor material so as to provide discontinuous regions 40 within the third layer 38. In particular embodiments of the present invention, the third layer 38 and the regions 40 are both AlInGaN based materials. The regions 40 may also be doped with Mg. In some embodiments of the present invention, the third layer 38 or certain regions of the third layer 38 are doped with Mg.

In some embodiments of the present invention, the first, second, third, fourth and fifth semiconductor materials may be the same semiconductor material or may be different semiconductor materials or combinations of different semiconductor materials. Furthermore, while illustrated as single layers, the first layer 32, second layer 36 and/or third layer 38 may be multiple layers, for example, in a multi-quantum well embodiment of the present invention.

In operation, the regions 34 and 40 in the first layer 32 and third layer 38 may introduce local modulation of the energy gap such that the ionization energy of dopants may be decreased which may increase the carriers available for transport. Furthermore, because the regions 34 and 40 are discontinuous, such an increase in available carriers may be provided without substantially hindering vertical transport.

While a particular diode structure is illustrated in FIG. 4, embodiments of the present invention are not limited to such a structure. For example, embodiments of the present invention may be suitable for use in light emitting devices and/or lasers such as those described in U.S. Pat. No. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 4,966,862 and/or 4,918,497, the disclosures of which are incorporated herein by reference as if set forth fully herein. Other suitable LEDs and/or lasers are described in U.S. Provisional Application Ser. No. 60/294,445, filed May 30, 2001 entitled "MULTI-QUANTUM WELL LIGHT EMITTING DIODE STRUCTURE," U.S. Provisional Application Ser. No. 60/294,308, filed May 30, 2001 entitled "LIGHT EMITTING DIODE STRUCTURE WITH SUPERLATTICE STRUCTURE" and U.S. Provisional Application Ser. No. 60/294,378, filed May 30, 2001 entitled "LIGHT EMITTING DIODE STRUCTURE WITH MULTI-QUANTUM WELL AND SUPERLATTICE STRUCTURE," as well as U.S. Provisional Application Ser. No. 60/265,707, filed Feb. 1, 2001 entitled "Light Emitting Diode With Optically Transparent Silicon Carbide Substrate," U.S. Provisional Application Ser. No. 60/307,235, filed Jul. 23, 2001, entitled "Light Emitting Diodes Including Modifications for Light Extraction and Manufacturing Methods Therefor" and U.S. patent application Ser. No. 10/057,821, filed Jan. 25, 2002, entitled "LIGHT EMITTING DIODES INCLUDING SUBSTRATE MODIFICATIONS FOR LIGHT EXTRACTION AND MANUFACTURING METHODS THEREFOR," the disclosures of which are incorporated herein as if set forth fully.

Still further embodiments of the present invention include methods of forming wide bandgap semiconductor devices by growing a wide bandgap semiconductor layer of first material type having a plurality of discontinuous wide bandgap semiconductor regions of second material type therein that have a wider bandgap relative to the wide bandgap semiconductor layer. These wider bandgap regions enhance the conductivity of the surrounding lower bandgap layer by decreasing the effective ionization energies of dopants in the lower bandgap layer. These methods include growing a wide bandgap layer of the first material type and then growing a wide bandgap layer of the second material type on the wide bandgap layer of the first material type. A step is then performed to pattern the wide bandgap layer of the second material type to define openings therein that expose portions of the wide bandgap layer of the first material type. These openings are then filled by growing another layer of the wide bandgap layer of the first material type in the openings and on top of the patterned wide bandgap layer of the second material type. This sequence of steps is then repeated multiple times until a desired thickness is achieved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor device, comprising:
   a doped wide bandgap semiconductor layer having an array of discontinuous wide bandgap semiconductor regions therein that are doped and contribute to a reduction in ionization energies of dopants in said wide bandgap semiconductor layer relative to an otherwise equivalent wide bandgap semiconductor layer that is devoid of the array of discontinuous wide bandgap semiconductor regions.

2. The device of claim 1, wherein the array of discontinuous wide bandgap semiconductor regions is a three-dimensional array.

3. The device of claim 1, wherein said wide bandgap semiconductor layer has a plurality of two-dimensional arrays of discontinuous wide bandgap semiconductor regions therein that are parallel to each other.

4. The device of claim 1, wherein the discontinuous wide bandgap semiconductor regions in the array are nonuniformly spaced from each other.

5. The device of claim 1, wherein the discontinuous wide bandgap semiconductor regions in the array have nonuniform sizes and shapes.

6. The device of claim 1, wherein said wide bandgap semiconductor layer has a plurality of two-dimensional regular arrays of discontinuous wide bandgap semiconductor regions therein that are parallel to each other.

7. The device of claim 6, wherein the plurality of two-dimensional regular arrays of discontinuous wide bandgap semiconductor regions are staggered relative to each other.

8. The device of claim 1, wherein said wide bandgap semiconductor layer and the wide bandgap semiconductor regions are of net first conductivity type; and wherein the wide bandgap semiconductor regions are more highly doped with first conductivity type dopants relative to said wide bandgap semiconductor layer.

9. A semiconductor device, comprising:
   a doped wide bandgap semiconductor layer having an array of discontinuous wide bandgap semiconductor regions therein that are doped and have a wider bandgap relative to said wide bandgap semiconductor layer.

10. The device of claim 9, wherein the array of discontinuous wide bandgap semiconductor regions is a three-dimensional array.

11. The device of claim 9, wherein said wide bandgap semiconductor layer has a plurality of two-dimensional arrays of discontinuous wide bandgap semiconductor regions therein that are parallel to each other.

12. The device of claim 9, wherein the discontinuous wide bandgap semiconductor regions in the array are nonuniformly spaced from each other.

13. The device of claim 9, wherein the discontinuous wide bandgap semiconductor regions in the array have nonuniform sizes and shapes.

14. The device of claim 9, wherein said wide bandgap semiconductor layer has a plurality of two-dimensional regular arrays of discontinuous wide bandgap semiconductor regions therein that are parallel to each other.

15. The device of claim 14, wherein the plurality of two-dimensional regular arrays of discontinuous wide bandgap semiconductor regions are staggered relative to each other.

16. The device of claim 9, wherein said wide bandgap semiconductor layer and the wide bandgap semiconductor regions are of net first conductivity type; and wherein the wide bandgap semiconductor regions are more highly doped with first conductivity type dopants relative to said wide bandgap semiconductor layer.

17. A semiconductor device, comprising:
   a doped Group III nitride layer comprising an array of discontinuous Group III nitride regions therein that are doped and have a wider bandgap relative to said Group III nitride layer.

18. The device of claim 17, wherein the array of discontinuous Group III nitride regions is a three-dimensional array.

19. The device of claim 17, wherein said Group III nitride layer has a plurality of two-dimensional arrays of discontinuous Group III nitride regions therein that are parallel to each other.

20. The device of claim 17, wherein the discontinuous Group III nitride regions in the array are nonuniformly spaced from each other.

21. The device of claim 17, wherein the discontinuous Group III nitride regions in the array have nonuniform sizes and shapes.

22. The device of claim 17, wherein said Group III nitride layer has a plurality of two-dimensional regular arrays of discontinuous Group III nitride regions therein that are parallel to each other.

23. The device of claim 22, wherein the plurality of two-dimensional regular arrays of discontinuous Group III nitride regions are staggered relative to each other.

24. The device of claim 17, wherein said Group III nitride layer and the Group III nitride regions are of net first conductivity type; and wherein the Group III nitride regions are more highly doped with first conductivity type dopants relative to said Group III nitride layer.

25. The device of claim 24, wherein said Group III nitride layer and the Group III nitride regions comprise different concentrations of the same constituent Group III elements.

26. A semiconductor device, comprising:
   a Group III nitride layer comprising an array of discontinuous Group III nitride regions therein that have a wider bandgap relative to said Group III nitride layer;
   wherein said Group III nitride layer and the Group III nitride regions are of net first conductivity type;
   wherein the Group III nitride regions are more highly doped with first conductivity type dopants relative to said Group III nitride layer
   wherein said Group III nitride layer and the Group III nitride regions comprise different concentrations of the same constituent Group III elements; and
   wherein said Group III nitride layer comprises $Al_w In_x Ga_{1-w-x}N$ and the Group III nitride regions comprise $Al_y In_z Ga_{1-y-z}N$.

27. The device of claim 17, wherein said Group III nitride layer and the Group III nitride regions comprise different concentrations of the same constituent Group III elements.

28. A semiconductor device, comprising:

a Group III nitride layer comprising an array of discontinuous Group III nitride regions therein that have a wider bandgap relative to said Group III nitride layer;

wherein said Group III nitride layer and the Group III nitride regions comprise different concentrations of the same constituent Group III elements; and wherein said Group III nitride layer comprises $Al_wIn_xGa_{1-w-x}N$ and the Group III nitride regions comprise $Al_yIn_zGa_{1-y-z}N$.

29. A semiconductor device, comprising:

a wide bandgap semiconductor layer having an array of discontinuous wide bandgap semiconductor regions therein that have wider bandgaps relative to said wide bandgap semiconductor layer and are doped at sufficient levels to increase an electrical conductivity of said first wide bandgap semiconductor layer relative to an otherwise equivalent wide bandgap semiconductor layer that is devoid of the array of discontinuous wide bandgap semiconductor regions.

30. The device of claim 29, wherein the array of discontinuous wide bandgap semiconductor regions is a three-dimensional array.

31. The device of claim 29, wherein said wide bandgap semiconductor layer has a plurality of two-dimensional arrays of discontinuous wide bandgap semiconductor regions therein that are parallel to each other.

32. The device of claim 29, wherein the discontinuous wide bandgap semiconductor regions in the array are nonuniformly spaced from each other.

33. The device of claim 29, wherein the discontinuous wide bandgap semiconductor regions in the array have nonuniform sizes and shapes.

34. The device of claim 29, wherein said wide bandgap semiconductor layer has a plurality of two-dimensional regular arrays of discontinuous wide bandgap semiconductor regions therein that are parallel to each other.

35. The device of claim 34, wherein the plurality of two-dimensional regular arrays of discontinuous wide bandgap semiconductor regions are staggered relative to each other.

36. The device of claim 29, wherein said wide bandgap semiconductor layer and the wide bandgap semiconductor regions are of net first conductivity type; and wherein the wide bandgap semiconductor regions are more highly doped with first conductivity type dopants relative to said wide bandgap semiconductor layer.

37. A semiconductor diode, comprising:

a first wide bandgap semiconductor layer of first conductivity type having a first plurality of discontinuous wide bandgap semiconductor regions of first conductivity type therein that have a wider bandgap relative to said first wide bandgap semiconductor layer and contribute to an increase in conductivity of the first wide bandgap semiconductor layer by reducing an effective ionization energy of first conductivity type dopants therein; and a second wide bandgap semiconductor layer of second conductivity type having a second plurality of discontinuous wide bandgap semiconductor regions of second conductivity type therein that have a wider bandgap relative to said second wide bandgap semiconductor layer and contribute to an increase in conductivity of the second wide bandgap semiconductor layer by reducing an effective ionization energy of second conductivity type dopants therein.

38. The semiconductor diode of claim 37, further comprising a third semiconductor layer extending between said first and second wide bandgap semiconductor layers, said third semiconductor layer comprising a material having a bandgap that is less than a bandgap of said first wide bandgap semiconductor layer and less than a bandgap of said second wide bandgap semiconductor layer.

39. A semiconductor device, comprising:

an $Al_wIn_xGa_{1-w-x}N$ layer comprising an array of discontinuous $Al_yIn_zGa_{1-y-z}N$ regions therein that have a wider bandgap relative to said Group III nitride layer, said $Al_wIn_xGa_{1-w-x}N$ layer and said $Al_yIn_zGa_{1-y-z}N$ regions comprising different concentrations of constituent Group III elements.

* * * * *